(12) United States Patent
Bober

(10) Patent No.: US 10,062,930 B2
(45) Date of Patent: Aug. 28, 2018

(54) BATTERY CELL ASSEMBLY

(71) Applicant: LG Chem, Ltd., Seoul (KR)

(72) Inventor: Greg Bober, Saint Clair Shores, MI (US)

(73) Assignee: LG Chem, Ltd., Seoul (KR)

( * ) Notice: Subject to any disclaimer, the term of this patent is extended or adjusted under 35 U.S.C. 154(b) by 642 days.

(21) Appl. No.: 14/831,120

(22) Filed: Aug. 20, 2015

(65) Prior Publication Data

US 2017/0054185 A1 Feb. 23, 2017

(51) Int. Cl.
*H01M 10/48* (2006.01)
*G01R 31/36* (2006.01)
*H01M 10/42* (2006.01)

(52) U.S. Cl.
CPC ............ *H01M 10/48* (2013.01); *G01R 31/36* (2013.01); *H01M 10/486* (2013.01); *H01M 10/425* (2013.01)

(58) Field of Classification Search
CPC .. H01M 10/48; H01M 10/486; H01M 10/425; G01N 27/12; G01R 31/36; G01R 31/44
See application file for complete search history.

(56) References Cited

U.S. PATENT DOCUMENTS

| | | | |
|---|---|---|---|
| 6,152,597 A | 11/2000 | Potega | |
| 6,469,512 B2 | 10/2002 | Singh et al. | |
| 8,264,202 B2 | 9/2012 | Sahu et al. | |
| 8,341,449 B2 | 12/2012 | Daniel et al. | |
| 8,449,998 B2 | 5/2013 | Koetting | |
| 8,489,264 B2 | 7/2013 | Morita et al. | |
| 8,519,674 B2 | 8/2013 | Anderson et al. | |
| 8,519,716 B2 | 8/2013 | Kurata | |
| 9,780,416 B2 * | 10/2017 | Bober | H01M 10/486 |
| 2005/0079393 A1 | 4/2005 | Shu et al. | |
| 2005/0103775 A1 | 5/2005 | Nelson et al. | |
| 2006/0289421 A1 | 12/2006 | Axinte et al. | |
| 2007/0111091 A1 | 5/2007 | Hiratsuka et al. | |
| 2008/0254348 A1 | 10/2008 | Hatta et al. | |
| 2010/0104929 A1 | 4/2010 | Gutsch | |

(Continued)

FOREIGN PATENT DOCUMENTS

| | | |
|---|---|---|
| DE | 102011016373 A1 | 10/2012 |
| EP | 0795206 B1 | 4/1999 |

(Continued)

*Primary Examiner* — R S Luebke
*Assistant Examiner* — Paul Baillargeon
(74) *Attorney, Agent, or Firm* — Buckert Patent & Trademark Law Firm PC; John F. Buckert

(57) ABSTRACT

A battery cell assembly includes a thin sensor assembly having a plastic sheet, first, second, third, and fourth conductive pads, first and second resistive traces, a sensing circuit, a microprocessor, and an electrical connector. The plastic sheet has a first side and a second side. The plastic sheet further having first and second sheet portions, a first connecting portion, and first, second, and third tabs. The first connecting portion is coupled to and between the first and second sheet portions. The first and second resistive traces are disposed directly on and coupled to the first and second sheet portions, respectively. The first and second conductive pads are disposed directly on and coupled to the first and second tabs, respectively, on the first side.

12 Claims, 11 Drawing Sheets

(56) References Cited

U.S. PATENT DOCUMENTS

| | | |
|---|---|---|
| 2010/0209768 A1 | 8/2010 | Ahn et al. |
| 2011/0039137 A1 | 2/2011 | Engle et al. |
| 2012/0015215 A1 | 1/2012 | Kim |
| 2012/0028083 A1 | 2/2012 | Jung |
| 2012/0242144 A1 | 9/2012 | Chorian et al. |
| 2013/0004811 A1 | 1/2013 | Banerjee et al. |
| 2013/0288091 A1 | 10/2013 | Tsubaki et al. |
| 2014/0014403 A1 | 1/2014 | Miller et al. |
| 2015/0072190 A1 | 3/2015 | Bober |
| 2015/0094970 A1 | 4/2015 | Bober |
| 2015/0380697 A1* | 12/2015 | Osborne ............ H01M 2/1061 429/91 |

FOREIGN PATENT DOCUMENTS

| | | |
|---|---|---|
| JP | 2013123357 | 1/2013 |
| KR | 20100003143 | 1/2010 |
| KR | 101224704 | 5/2011 |
| KR | 20110053255 | 5/2011 |
| KR | 20120005366 | 1/2012 |
| KR | 20130004042 | 1/2013 |
| WO | 9510127 | 4/1995 |
| WO | 2012093572 A1 | 7/2012 |
| WO | 2013147292 A1 | 10/2013 |
| WO | 2013147659 A1 | 10/2013 |
| WO | 2014095146 A1 | 6/2014 |
| WO | 2015034280 A1 | 3/2015 |

* cited by examiner

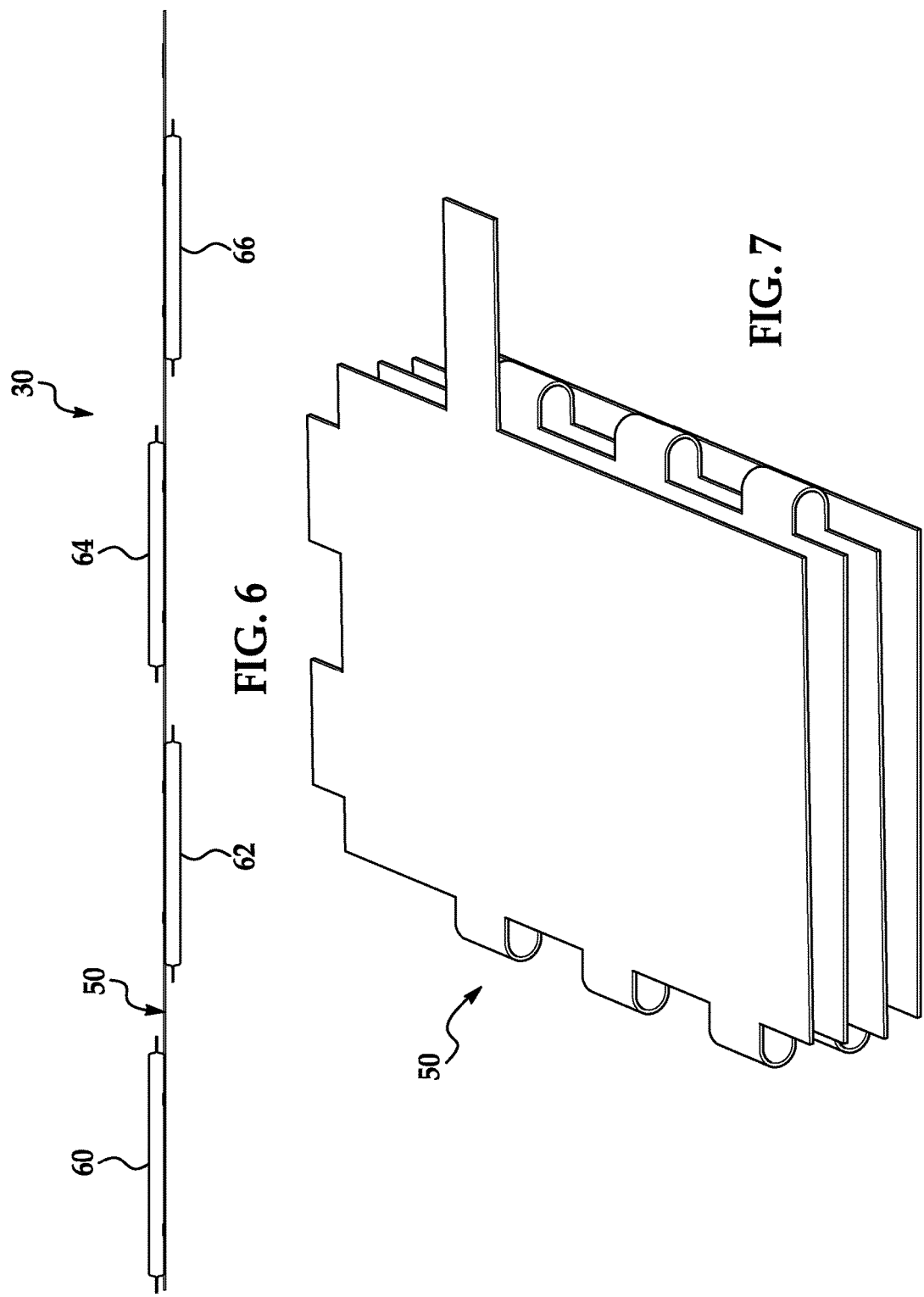

US 10,062,930 B2

1

BATTERY CELL ASSEMBLY

BACKGROUND

The inventor herein has recognized a need for a battery cell assembly that utilizes a thin sensor assembly coupled directly to a plurality of battery cells for determining temperature levels and voltages of the battery cells.

SUMMARY

A battery cell assembly in accordance with an exemplary embodiment is provided. The battery cell assembly includes a thin sensor assembly having a plastic sheet, first, second, third, and fourth conductive pads, first and second resistive traces, a sensing circuit, a microprocessor, and an electrical connector. The plastic sheet has a first side and a second side. The plastic sheet further includes first and second sheet portions, a first connecting portion, and first, second, and third tabs. The first connecting portion is coupled to and between the first and second sheet portions. The first and second resistive traces are disposed directly on and coupled to the first and second sheet portions, respectively. The first and second conductive pads are disposed directly on and coupled to the first and second tabs, respectively, on the first side. The third conductive pad is disposed directly on and coupled to the second tab on the second side. The third conductive pad is electrically coupled to the second conductive pad. The fourth conductive pad is disposed directly on and coupled to the third tab on the second side. The microprocessor is coupled to at least one of the first and second sheet portions. The microprocessor is electrically coupled to the sensing circuit and the electrical connector. The sensing circuit is coupled to at least one of the first and second sheet portions. The sensing circuit is electrically coupled to the first and second resistive traces. The battery cell assembly further includes a first battery cell having a first housing and first and second electrical terminals extending from the first housing. The first housing is disposed directly on the first sheet portion and on the first side. The first electrical terminal of the first battery cell is disposed directly on and coupled to the first conductive pad. The second electrical terminal of the first battery cell is disposed directly on and coupled to the second conductive pad. The battery cell assembly further includes a second battery cell having a second housing and first and second electrical terminals extending from the second housing. The second housing is disposed directly on the second sheet portion and on the second side. The first electrical terminal of the second battery cell is disposed directly on and coupled to the third conductive pad. The second electrical terminal of the second battery cell is disposed directly on and coupled to the fourth conductive pad.

BRIEF DESCRIPTION OF THE DRAWINGS

FIG. 6 is a side view of the battery cell assembly of FIG. 1 prior to a plurality of battery cells therein being positioned in a stacked orientation;

FIG. 7 is a schematic of a plastic sheet of a thin sensor assembly utilized in the battery cell assembly of FIG. 1;

DETAILED DESCRIPTION

Referring to FIGS. 1-7, a battery cell assembly 30 in accordance with an exemplary embodiment is provided. The battery cell assembly 30 includes a thin sensor assembly 50 and first, second, third, and fourth battery cells 60, 62, 64, 66. An advantage of the battery cell assembly 30 is that the assembly 30 utilizes the thin sensor assembly 50 having a flexible plastic sheet 80 that is disposed between the stacked battery cells 60-66 to determine temperature levels and voltage levels of the battery cells 60-66.

For purposes of understanding, the term "trace" means a thin electrically conductive member herein.

Figure 8:
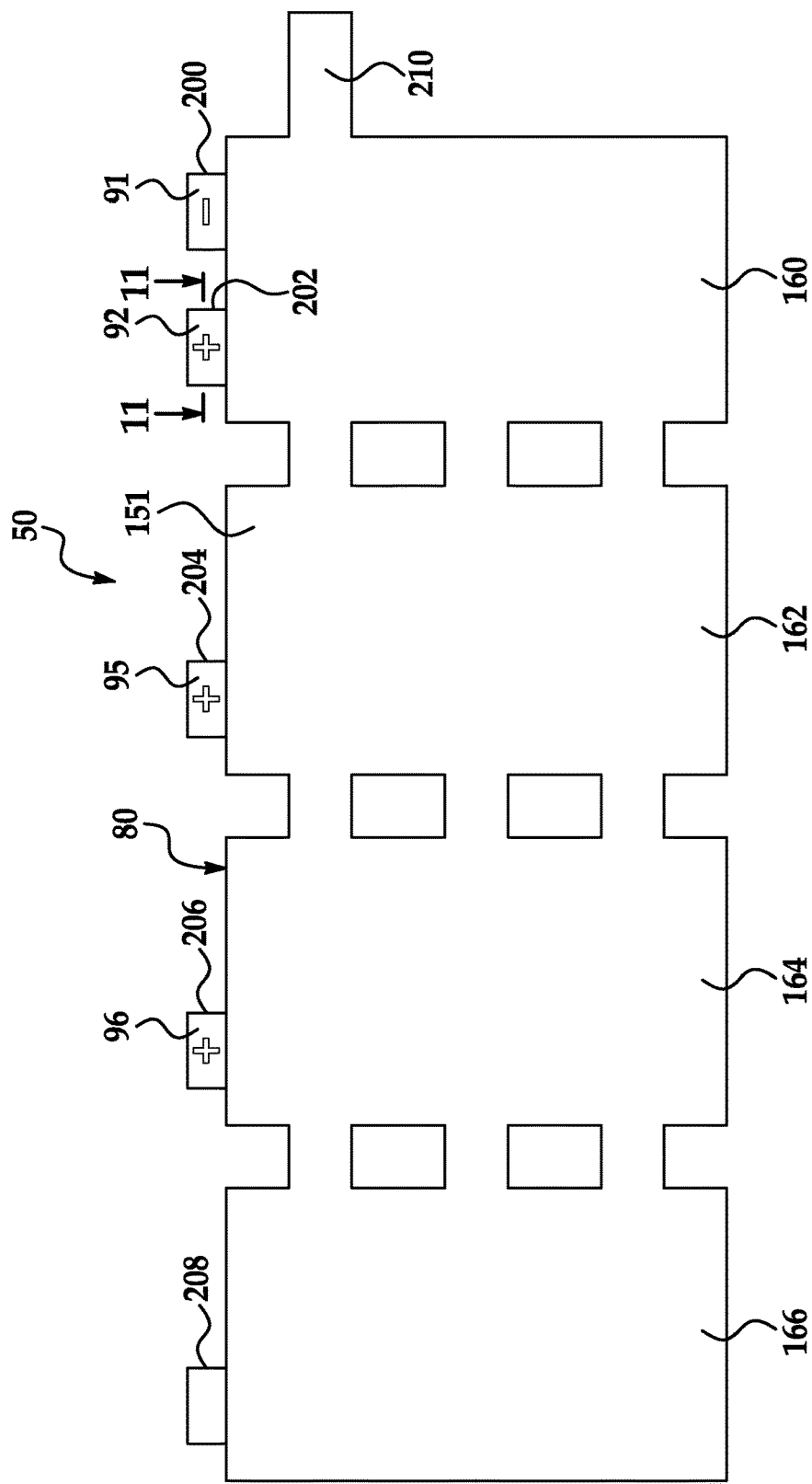
FIG. 8 is a schematic of a first side of the thin sensor assembly of FIG. 7 in a flattened orientation.
Figure 9:
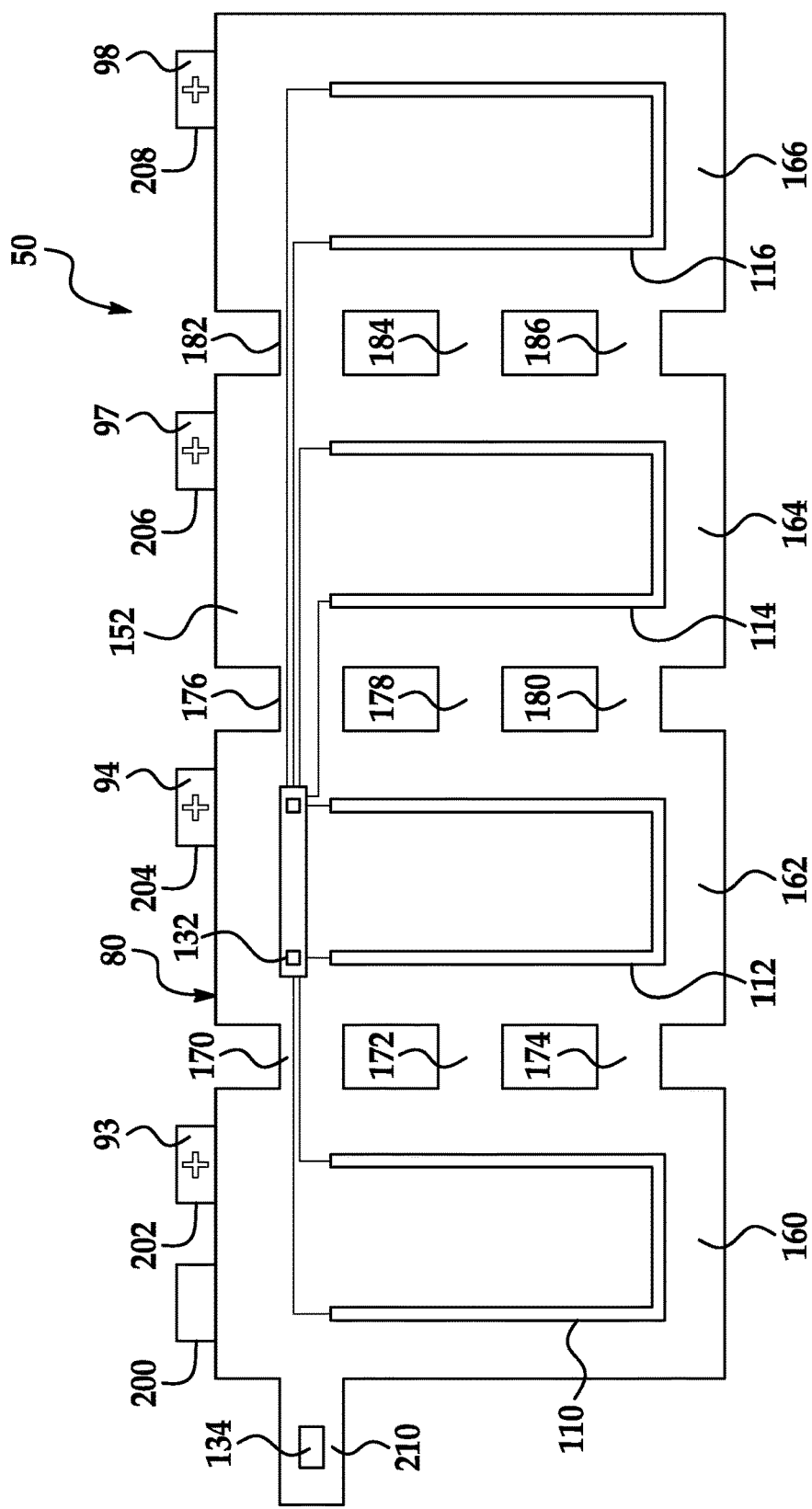
FIG. 9 is a schematic of a second side of the thin sensor assembly of FIG. 7 in a flattened orientation.
Figure 10:
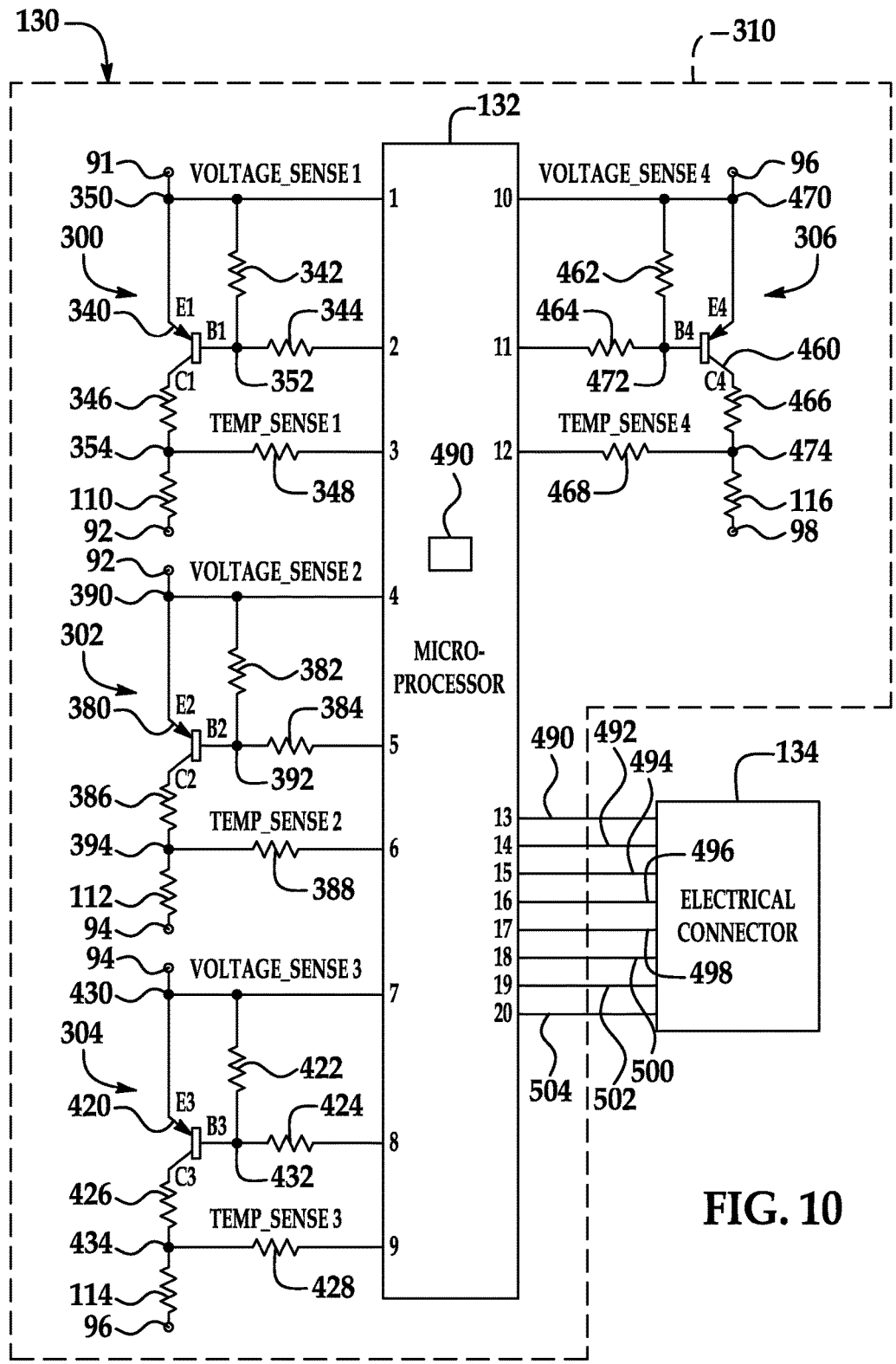
FIG. 10 is a block diagram of a microprocessor and a sensing circuit utilized in the battery cell assembly of FIG. 1.

Referring to FIGS. 8-10, the thin sensor assembly 50 is provided to determine temperature levels and voltage levels of the first, second, third, and fourth battery cells 60, 62, 64, 66. The thin sensor assembly 50 includes a plastic sheet 80, conductive pads 91, 92, 93, 94, 95, 96, 97, 98, resistive traces 110, 112, 114, 116, a sensing circuit 130, a microprocessor 132, and an electrical connector 134.

Referring to FIGS. 8 and 9, the plastic sheet 80 has a first side 151 and a second side 152 disposed opposite and substantially parallel to the first side 151. The plastic sheet 80 further includes sheet portions 160, 162, 164, 166, connecting portions 170, 172, 174, 176, 178, 180, 182, 184, 186, and tabs 200, 202, 204, 206, 208.

The sheet portions 160, 162, 164, 166 are each substantially rectangular-shaped. In an alternative embodiment, the sheet portions 160, 162, 164, 166 could each have an alternative shape. For example, the sheet portions 160, 162, 164, 166 could be substantially circular-shaped, triangular-shaped, or oval-shaped.

Figure 11:
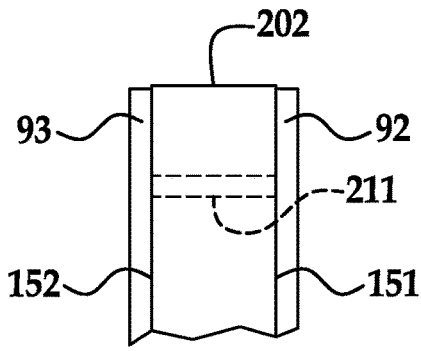
FIG. 11 is a cross-sectional schematic of a portion of a thin sensor assembly of FIG. 8 taken along lines 11-11.

The sheet portion 160 has the tabs 200, 202 extending outwardly from a top edge of the sheet portion 160. Further, the tab 210 extends outwardly from a first side edge of the sheet portion 160 and holds the electrical connector 134 thereon. The conductive pad 91 is disposed directly on and is coupled to the tab 210 on the first side 151. The conductive pad 92 is disposed directly on and is coupled to the tab 202 on the first side 151. The conductive pad 93 is disposed directly on and is coupled to the tab 202 on the second side 152. Further, the conductive pad 93 is electrically coupled to the conductive pad 92 via an electrical wire 211 (shown in FIG. 11).

Figure 5:
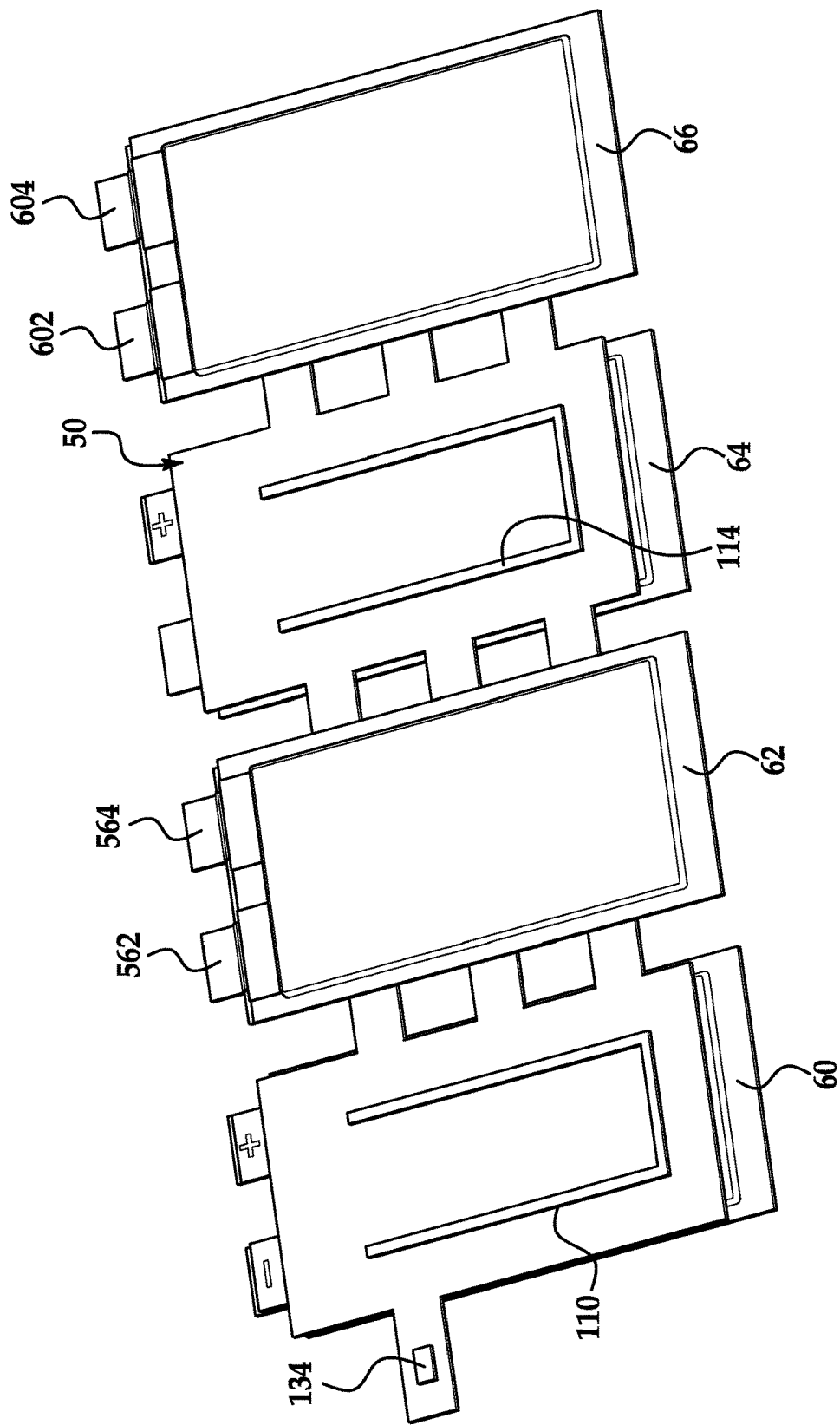
FIG. 5 is another exploded view of the battery cell assembly of FIG. 1.

Referring to FIGS. 5 and 9, the resistive trace 110 is disposed directly on and is coupled to the sheet portion 160 on the second side 152. The resistive trace 110 has a resistance level that varies based on a temperature level of the battery cell 60, and is used by the microprocessor 132 to determine the temperature level of the battery cell 60 disposed proximate to the resistive trace 110. In an exemplary embodiment, the resistive trace 110 has a thickness in a range of 0.33-1.0 millimeters. Of course, in an alternative embodiment, the resistive trace 110 could have a thickness greater than 1.0 millimeter. In an exemplary embodiment, the resistive trace 110 is constructed of at least one of graphite, nickel, tin, silver, copper, or an alloy of at least two of the foregoing materials.

The connecting portions 170, 172, 174 are coupled to and between the sheet portions 160, 162. The connecting portions 170, 172, 174 are bendable such that the sheet portion 160 can be disposed substantially parallel to the sheet portion 162.

Referring to FIGS. 8 and 9, the sheet portion 162 has the tab 204 extending outwardly from a top edge of the sheet portion 162. The conductive pad 94 is disposed directly on and is coupled to the tab 204 on the second side 152. The conductive pad 95 is disposed directly on and is coupled to the tab 204 on the first side 151. Further, the conductive pad 95 is electrically coupled to the conductive pad 94.

Referring to FIGS. 5 and 9, the resistive trace 112 is disposed directly on and is coupled to the sheet portion 162 on the second side 152. The resistive trace 112 has a resistance level that varies based on a temperature level of the battery cell 62 that is disposed against the resistive trace 112, and is used by the microprocessor 132 to determine the temperature level of the battery cell 62. In an exemplary embodiment, the resistive trace 112 has a thickness in a range of 0.33-1.0 millimeters. Of course, in an alternative embodiment, the resistive trace 112 could have a thickness greater than 1.0 millimeter. In an exemplary embodiment, the resistive trace 112 is constructed of at least one of graphite, nickel, tin, silver, copper, or an alloy of at least two of the foregoing materials.

The connecting portions 176, 178, 180 are coupled to and between the sheet portions 162, 164. The connecting portions 176, 178, 180 are bendable such that the sheet portion 164 can be disposed substantially parallel to the sheet portion 162.

Referring to FIGS. 8 and 9, the sheet portion 164 has the tab 206 extending outwardly from a top edge of the sheet portion 164. The conductive pad 97 is disposed directly on and is coupled to the tab 206 on the second side 152. The conductive pad 96 is disposed directly on and is coupled to the tab 206 on the first side 151. Further, the conductive pad 96 is electrically coupled to the conductive pad 97.

Referring to FIGS. 5 and 9, the resistive trace 114 is disposed directly on and is coupled to the sheet portion 164 on the second side 152. The resistive trace 114 has a resistance level that varies based on a temperature level of the battery cell 64 that is disposed proximate to the resistive trace 114, and is used by the microprocessor 132 to determine the temperature level of the battery cell 64. In an exemplary embodiment, the resistive trace 114 has a thickness in a range of 0.33-1.0 millimeters. Of course, in an alternative embodiment, the resistive trace 114 could have a thickness greater than 1.0 millimeter. In an exemplary embodiment, the resistive trace 114 is constructed of at least one of graphite, nickel, tin, silver, copper, or an alloy of at least two of the foregoing materials.

The connecting portions 182, 184, 186 are coupled to and between the sheet portions 164, 166. The connecting portions 182, 184, 186 are bendable such that the sheet portion 166 can be disposed substantially parallel to the sheet portion 164.

Referring to FIGS. 8 and 9, the sheet portion 166 has the tab 208 extending outwardly from a top edge of the sheet portion 166. The conductive pad 98 is disposed directly on and is coupled to the tab 208 on the second side 152.

Referring to FIGS. 5 and 9, the resistive trace 116 is disposed directly on and is coupled to the sheet portion 166 on the second side 152. The resistive trace 116 has a resistance level that varies based on a temperature level of the battery cell 66 that is disposed against the resistive trace 116, and is used by the microprocessor 132 to determine the temperature level of the battery cell 66. In an exemplary embodiment, the resistive trace 116 has a thickness in a range of 0.33-1.0 millimeters. Of course, in an alternative embodiment, the resistive trace 116 could have a thickness greater than 1.0 millimeter. In an exemplary embodiment, the resistive trace 116 is constructed of at least one of graphite, nickel, tin, silver, copper, or an alloy of at least two of the foregoing materials.

Referring to FIGS. 5, 9 and 10, the sensing circuit 130 is provided to generate signals indicative of the temperature levels and output voltage levels of the first, second, third, and fourth battery cells 60, 62, 64, 66. The sensing circuit 130 includes sensing sub-circuits 300, 302, 304, 306 and a circuit board 310. The sensing sub-circuits 300, 302, 304, 306 are electrically coupled to the resistive traces 110, 112, 114, 116, respectively, and to the first, second, third, and fourth battery cells 60, 62, 64, 66, respectively. In an exemplary embodiment, the circuit board 310 is disposed on coupled to the sheet portion 162 on the second side 152. Further, the sub-circuits 300, 302, 304, 306 are disposed on and are coupled to the circuit board 310.

Referring to FIGS. 4 and 8-10, the sensing sub-circuit 300 includes a transistor 340, resistors 342, 344, 346, 348, and nodes 350, 352, 354. The resistive trace 110 has a resistance level that varies based on a temperature level of the battery cell 60. The transistor 340 includes a base B1, an emitter E1, and a collector C1. The emitter E1 is electrically coupled to a node 350 which is further electrically coupled to the conductive pad 91. The conductive pad 91 is further coupled to the electrical terminal 542 of the battery cell 60. The node 350 is further electrically coupled to the I/O port 1 of the microprocessor 132. The base B1 is electrically coupled to a node 352. The resistor 342 is electrically coupled between the node 350 and the node 352. Further, the resistor 344 is electrically coupled between the node 352 and the I/O port 2. The resistor 346 is electrically coupled between the collector C1 and the node 354. Further, the resistive trace 110 is electrically coupled between the node 354 the conductive pad 92. The conductive pad 92 is further coupled to the electrical terminal 544 of the battery cell 60. Thus, the resistor 346 is electrically coupled in series with the resistive trace 110, and the electrical node 354 is electrically coupled therebetween. The resistor 346 is further electrically coupled to an operational voltage when the transistor 340 is turned on. The resistor 348 is electrically coupled between the node 354 and the I/O port 3.

To determine a temperature level of the battery cell 60, the microprocessor 132 is programmed to output a low logic level voltage on the I/O port 2 to turn on the transistor 340. When the transistor 340 is turned on, the microprocessor 132 is programmed to measure the voltage (temp_sense1) on the resistor 348 at the I/O port 3. The microprocessor 132 is further programmed to determine a temperature value representing the temperature level of the battery cell 60 based on the voltage (temp_sense1). In an exemplary embodiment, the microprocessor 132 utilizes a lookup table stored in the memory device 490 that has a plurality of voltage values (corresponding to voltage levels at the I/O port 3) and a plurality of associated temperature levels of the battery cell 60. The microprocessor 132 utilizes a measured voltage level to access an associated temperature value in the lookup table, which corresponds to a temperature level of the battery cell 60.

The microprocessor 132 is further programmed to measure a voltage on the I/O port 1 to determine either a $V_{open}$ or a $V_{load}$ voltage of the battery cell 60. In particular, the microprocessor 132 measures a voltage on the I/O port 1 when the transistor 340 is turned off which corresponds to the $V_{open}$ voltage level of the battery cell 60. Alternately, the microprocessor measures a voltage on the I/O port 1 when the transistor 340 is turned on, which corresponds to the $V_{load}$ voltage level of the battery cell 60.

The sensing sub-circuit 302 includes a transistor 380, resistors 382, 384, 386, 348, and nodes 390, 392, 394. The resistive trace 112 has a resistance level that varies based on a temperature level of the battery cell 62. The transistor 380 includes a base B2, an emitter E2, and a collector C2. The emitter E2 is electrically coupled to a node 390 which is further electrically coupled to the conductive pad 92. The conductive pad 92 is further coupled to the electrical terminal 544 of the battery cell 60 (and electrically coupled to the electrical terminal 562 of the battery cell 62). The node 390 is further electrically coupled to the I/O port 4 of the microprocessor 132. The base B2 is electrically coupled to a node 392. The resistor 382 is electrically coupled between the node 390 and the node 392. Further, the resistor 384 is electrically coupled between the node 392 and the I/O port 5. The resistor 386 is electrically coupled between the collector C2 and the node 394. Further, the resistive trace 112 is electrically coupled between the node 394 the conductive pad 94, wherein conductive pad 94 is electrically coupled to the conductive pad 95. The conductive pad 94 is further coupled to the electrical terminal 564 of the battery cell 62. Thus, the resistor 386 is electrically coupled in series with the resistive trace 112, and the electrical node 394 is electrically coupled therebetween. The resistor 386 is further electrically coupled to an operational voltage when the transistor 380 is turned on. The resistor 388 is electrically coupled between the node 394 and the I/O port 6.

The microprocessor 132 is programmed to determine a temperature value representing the temperature level of the battery cell 62 based on the voltage (temp_sense2), in a similar manner as described above with respect to voltage (temp_sense1) for battery cell 60. Further, the microprocessor 132 is further programmed to measure a voltage on the I/O port 4 to determine either a $V_{open}$ or a $V_{load}$ voltage of the battery cell 62, in a similar manner as described above with respect to the voltage for battery cell 60.

The sensing sub-circuit 304 includes a transistor 420, resistors 422, 424, 426, 428, and nodes 430, 432, 434. The resistive trace 114 has a resistance level that varies based on a temperature level of the battery cell 64. The transistor 420 includes a base B3, an emitter E3, and a collector C3. The emitter E3 is electrically coupled to a node 430 which is further electrically coupled to the conductive pad 94, wherein the conductive pad 94 is further electrically coupled to both the electrical terminal 564 of the battery cell 62 and the electrical terminal 582 of the battery cell 64. The node 430 is further electrically coupled to the I/O port 7 of the microprocessor 132. The base B3 is electrically coupled to a node 432. The resistor 422 is electrically coupled between the node 430 and the node 432. Further, the resistor 424 is electrically coupled between the node 432 and the I/O port 8. The resistor 426 is electrically coupled between the collector C3 and the node 434. Further, the resistive trace 114 is electrically coupled between the node 434 the conductive pad 96, wherein conductive pad 96 is electrically coupled to the conductive pad 97. The conductive pad 96 is further coupled to the electrical terminal 584 of the battery cell 64. Thus, the resistor 426 is electrically coupled in series with the resistive trace 114, and the electrical node 434 is electrically coupled therebetween. The resistor 426 is further electrically coupled to an operational voltage when the transistor 420 is turned on. The resistor 428 is electrically coupled between the node 434 and the I/O port 9.

The microprocessor 132 is programmed to determine a temperature value representing the temperature level of the battery cell 64 based on the voltage (temp_sense3), in a similar manner as described above with respect to voltage (temp_sense1) for battery cell 60. Further, the microprocessor 132 is further programmed to measure a voltage on the I/O port 7 to determine either a $V_{open}$ or a $V_{load}$ voltage of the battery cell 64, in a similar manner as described above with respect to the voltage for battery cell 60.

The sensing sub-circuit 304 includes a transistor 460, resistors 462, 464, 466, 468, and nodes 470, 472, 474. The resistive trace 116 has a resistance level that varies based on a temperature level of the battery cell 66. The transistor 460 includes a base B4, an emitter E4, and a collector C4. The emitter E4 is electrically coupled to a node 470 which is further electrically coupled to the conductive pad 96, wherein the conductive pad 96 is further electrically coupled to both the electrical terminal 584 of the battery cell 64 and the electrical terminal 602 of the battery cell 66. The node 470 is further electrically coupled to the I/O port 10 of the microprocessor 132. The base B4 is electrically coupled to a node 472. The resistor 462 is electrically coupled between the node 470 and the node 472. Further, the resistor 464 is electrically coupled between the node 472 and the I/O port 11. The resistor 466 is electrically coupled between the collector C4 and the node 474. Further, the resistive trace 116 is electrically coupled between the node 474 the conductive pad 98. The conductive pad 98 is further coupled to the electrical terminal 604 of the battery cell 66. Thus, the resistor 466 is electrically coupled in series with the resistive trace 116, and the electrical node 474 is electrically coupled therebetween. The resistor 466 is further electrically coupled to an operational voltage when the transistor 460 is turned on. The resistor 468 is electrically coupled between the node 474 and the I/O port 12.

The microprocessor 132 is programmed to determine a temperature value representing the temperature level of the battery cell 66 based on the voltage (temp_sense4), in a similar manner as described above with respect to voltage (temp_sense1) for battery cell 60. Further, the microprocessor 132 is further programmed to measure a voltage on the I/O port 10 to determine either a $V_{open}$ or a $V_{load}$ voltage of the battery cell 66, in a similar manner as described above with respect to the voltage for battery cell 60.

Referring to FIGS. 9 and 10, the microprocessor 132 is programmed to receive signals from the sensing circuit 130 indicative of temperature levels and voltage levels of the battery cells 60, 62, 64, 66. The microprocessor 132 is further programmed to send binary messages indicating the temperature levels and voltage levels of the battery cell 60, 62, 64, 66 to the electrical connector 134 which may be further operably coupled to a vehicle computer (not shown). The I/O ports 13, 14, 15, 16, 17, 18, 19, 20 are electrically coupled to the electrical connector 134 via the electrical trace lines 490, 492, 494, 496, 498, 500, 502, 504, respectively, which are disposed on the second side 152 of the plastic sheet 80.

Referring to FIGS. 4, 5, 8 and 9, the first battery cell 60 has a housing 540 and electrical terminals 542, 544 extending from the housing 540. In an exemplary embodiment, the battery cell 60 is a lithium-ion pouch-type battery cell. Further, in the exemplary embodiment, the housing 540 is substantially rectangular-shaped. In an alternative embodiment, the first battery cell 60 could be another type of battery cell such as a nickel-metal-hydride battery cell, or a nickel-cadmium battery cell for example. The electrical terminal 542 is coupled to the conductive pad 91. Further, the electrical terminal 544 is electrically coupled to the conductive pad 92 and to the electrical terminal 562 of the battery cell 62.

Figure 1:
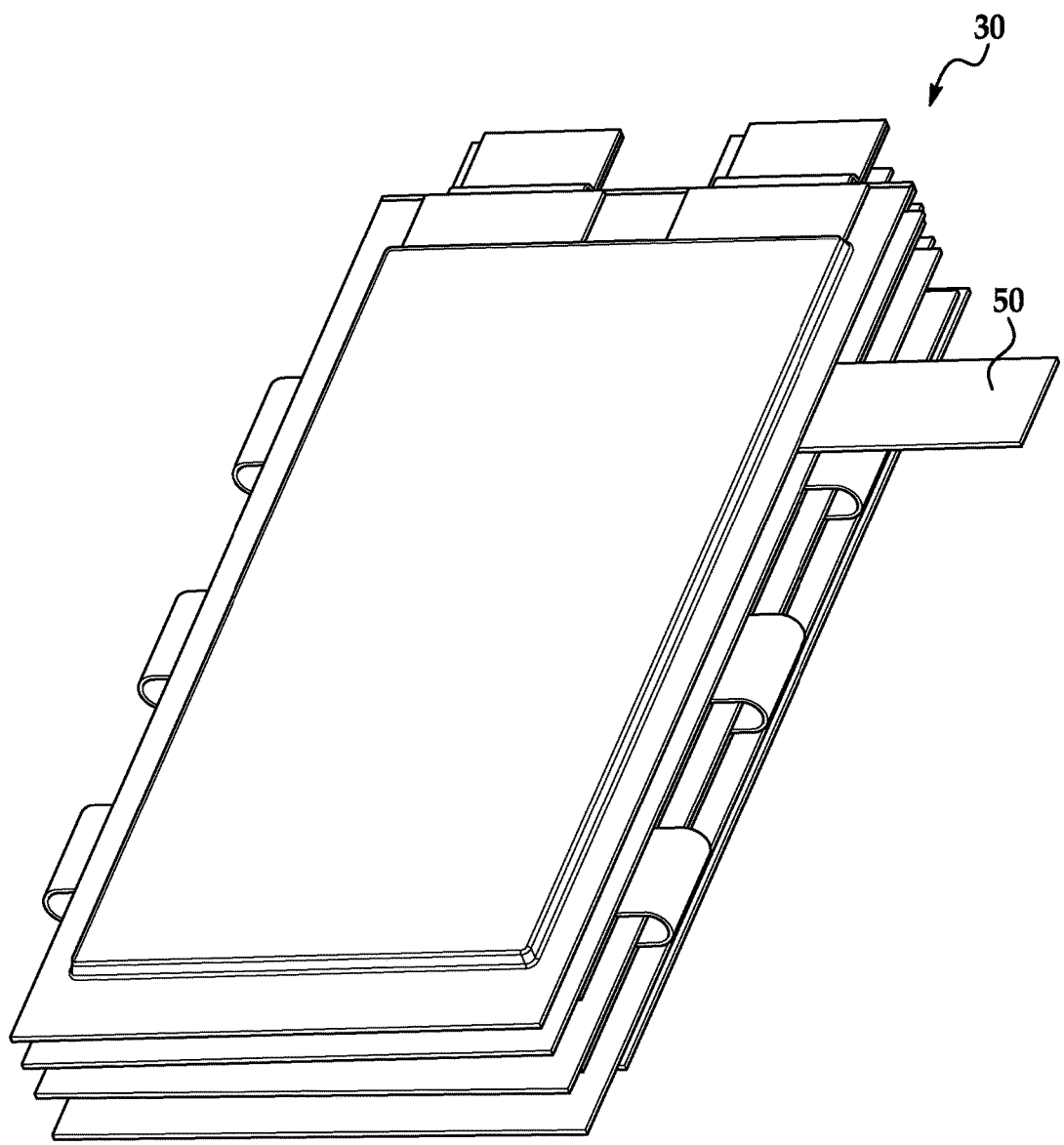
FIG. 1 is a schematic of a battery cell assembly in accordance with an exemplary embodiment.
Figure 2:
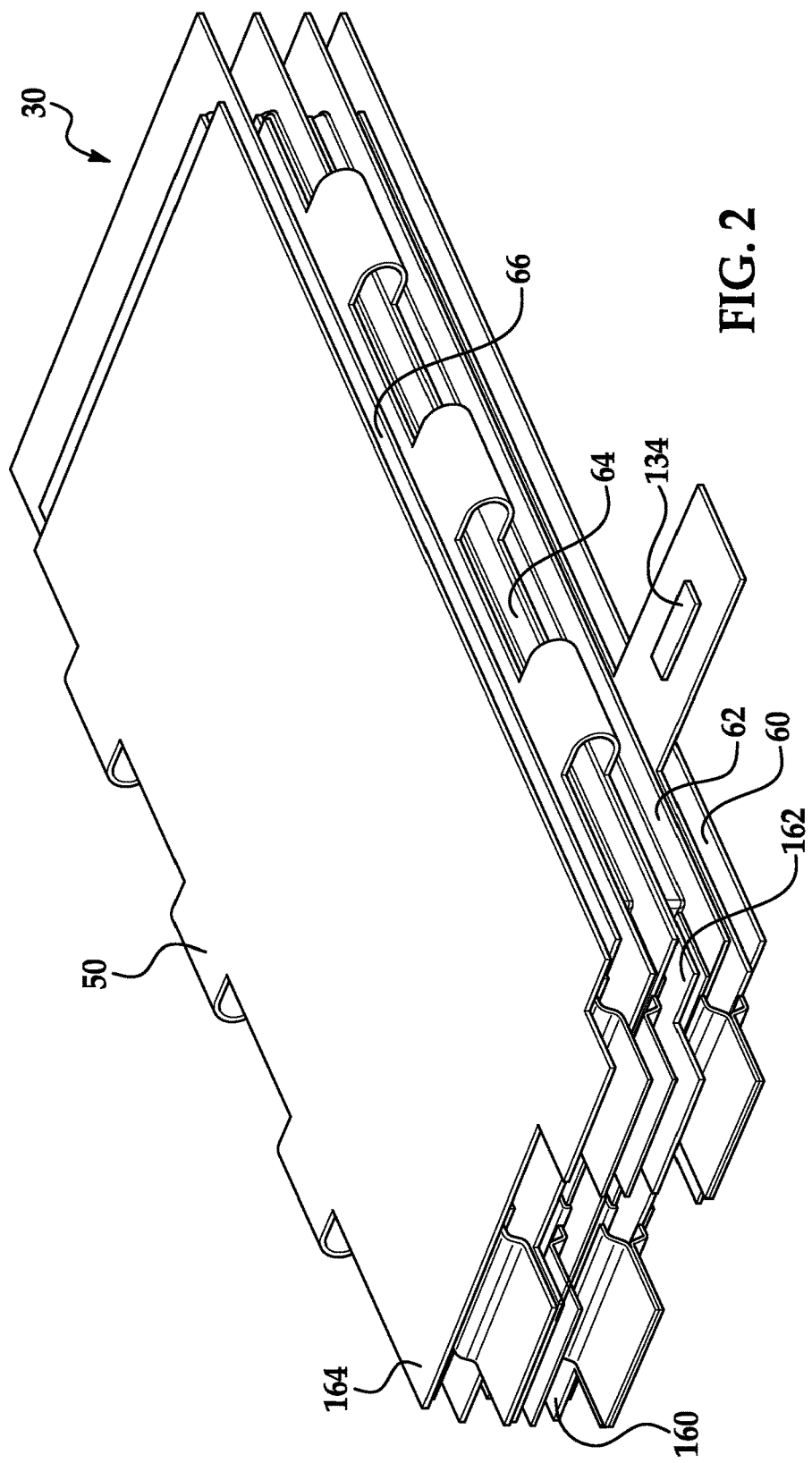
FIG. 2 is another schematic of the battery cell assembly of FIG. 1.
Figure 3:
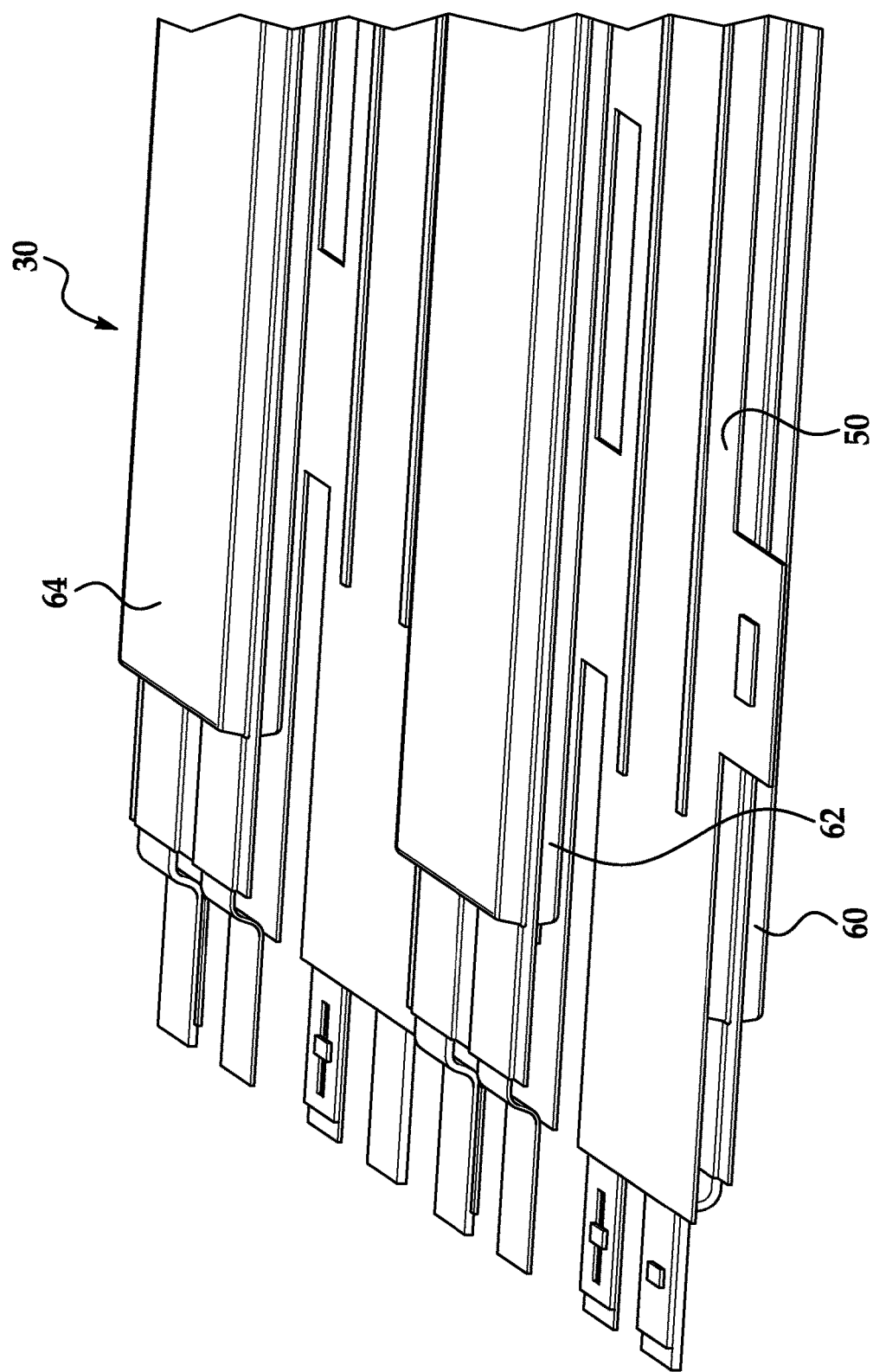
FIG. 3 is a schematic of a portion of the battery cell assembly of FIG. 1.
Figure 4:
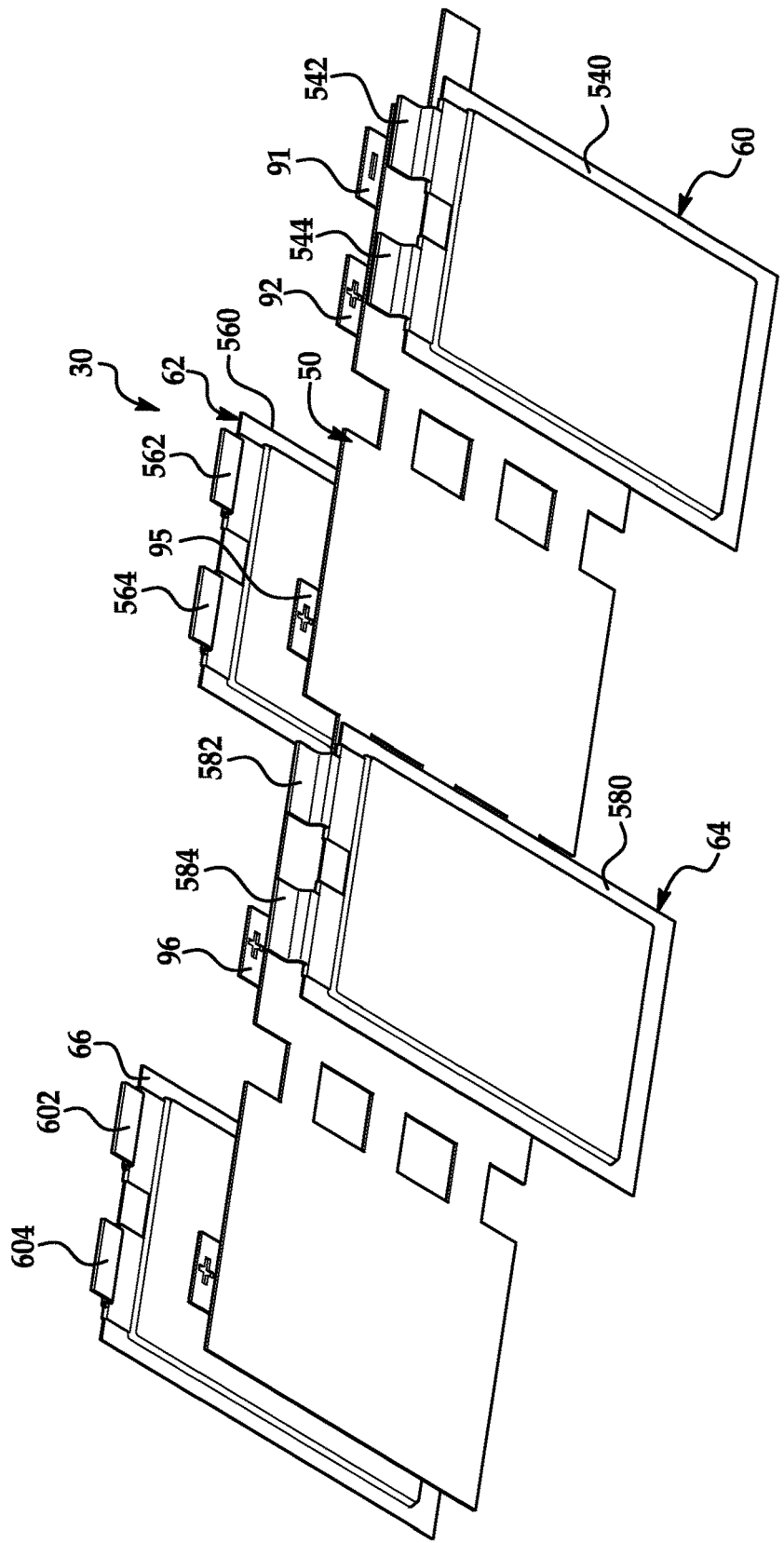
FIG. 4 is an exploded view of the battery cell assembly of FIG. 1.

The second battery cell 62 has a housing 560 and electrical terminals 562, 564 extending from the housing 560. In an exemplary embodiment, the second battery cell 62 is a lithium-ion pouch-type battery cell. Further, in the exemplary embodiment, the housing 560 is substantially rectangular-shaped. In an alternative embodiment, the second battery cell 62 could be another type of battery cell such as a nickel-metal-hydride battery cell, or a nickel-cadmium battery cell for example. The electrical terminal 562 is coupled to the electrical terminal 544 of the first battery cell 60. Further, the electrical terminal 564 is electrically coupled to the conductive pad 94. Referring to FIG. 2, the second battery cell 62 is sandwiched between and directly contacts the sheet portions 160, 162 on the second side 152.

Referring to FIGS. 4, 5, 8 and 9, the third battery cell 64 has a housing 580 and electrical terminals 582, 584 extending from the housing 580. In an exemplary embodiment, the third battery cell 64 is a lithium-ion pouch-type battery cell. Further, in the exemplary embodiment, the housing 580 is substantially rectangular-shaped. In an alternative embodiment, the third battery cell 64 could be another type of battery cell such as a nickel-metal-hydride battery cell, or a nickel-cadmium battery cell for example. The electrical terminal 582 is coupled to the conductive pad 95. Further, the electrical terminal 584 is electrically coupled to the conductive pad 96. Referring to FIG. 2, the third battery cell 64 is sandwiched between and directly contacts the sheet portions 162, 164 on the first side 151.

Referring to FIGS. 4, 5, 8 and 9, the fourth battery cell 66 has a housing 600 and electrical terminals 602, 604 extending from the housing 600. In an exemplary embodiment, the battery cell 66 is a lithium-ion pouch-type battery cell. Further, in the exemplary embodiment, the housing 600 is substantially rectangular-shaped. In an alternative embodiment, the fourth battery cell 66 could be another type of battery cell such as a nickel-metal-hydride battery cell, or a nickel-cadmium battery cell for example. The electrical terminal 602 is coupled to the electrical terminal 584. Further, the electrical terminal 604 is electrically coupled to the conductive pad 98. Referring to FIG. 2, the fourth battery cell 66 is sandwiched between and directly contacts the sheet portions 164, 166 on the second side 152.

Figure 12:
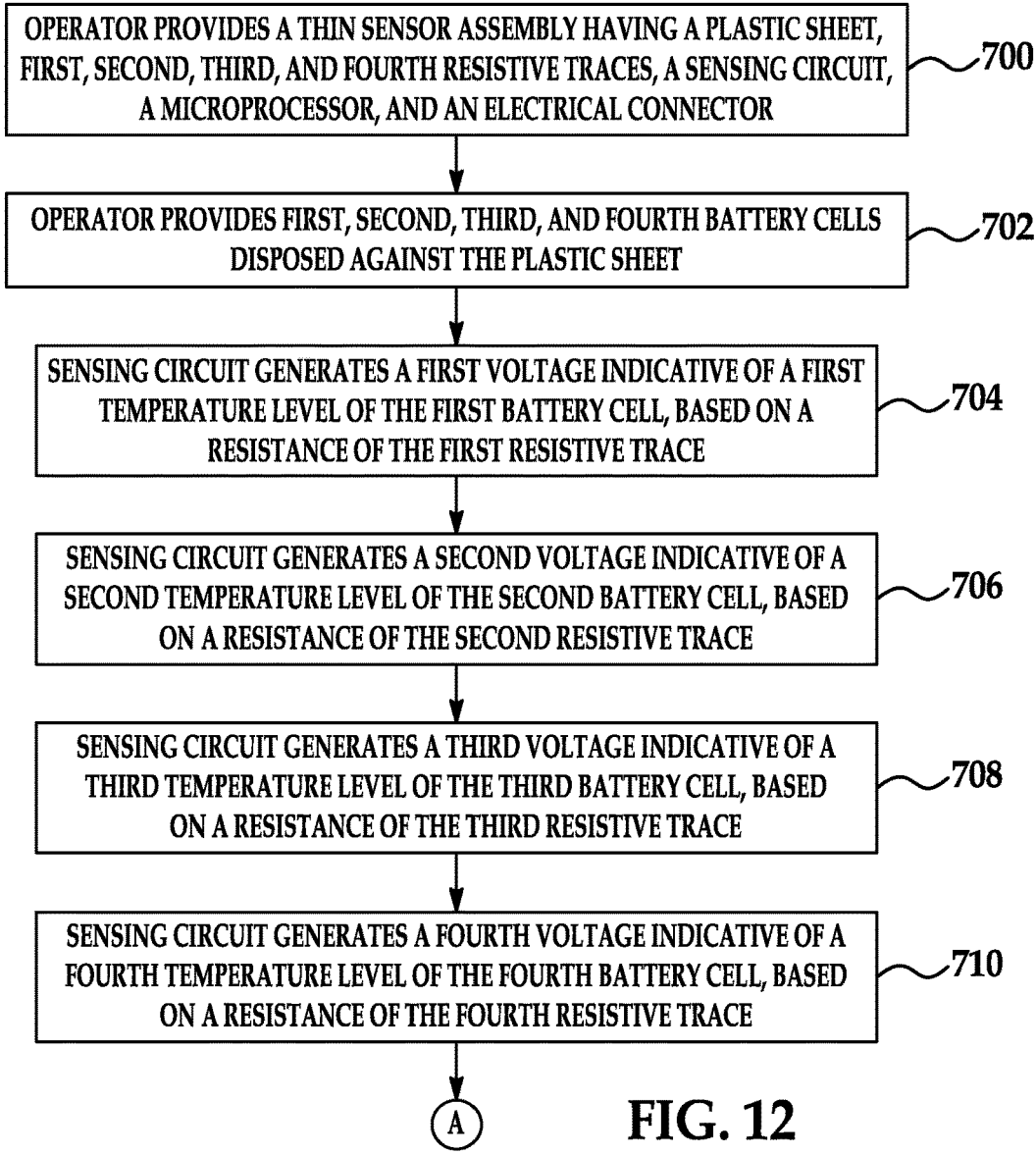
FIGS. 12 and 13 are flowcharts of a method of operating the thin sensor assembly of FIG. 8 to determine temperature levels and voltage levels of battery cells in the battery cell assembly of FIG. 1.
Figure 13:
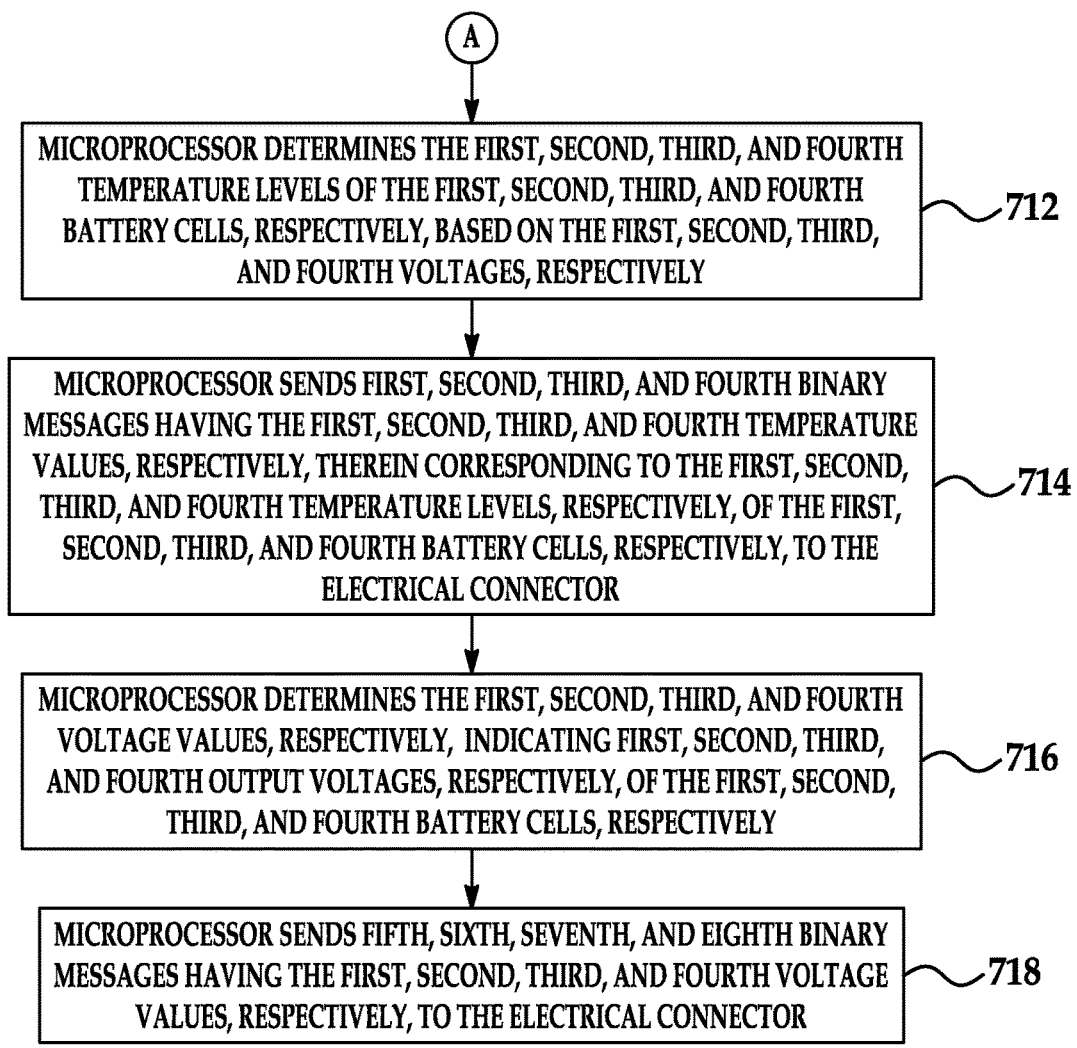

Referring to FIGS. 10, 12 and 13, a flowchart of a method of operating the thin sensor assembly 50 to determine temperature levels and voltage levels of the battery cells 60, 62, 64, 66 in the battery cell assembly 30 will now be described.

At step 700, the operator provides the thin sensor assembly 50 having the plastic sheet 80, resistive traces 110, 112, 114, 116, the sensing circuit 130, the microprocessor 132, and the electrical connector 134.

At step 702, the operator provides first, second, third and fourth battery cells 60, 62, 64, 66 disposed directly against the plastic sheet 80.

At step 704, the sensing circuit 130 generates a first voltage indicative of a first temperature level of the first battery cell 60, based on a resistance of the resistive trace 100.

At step 706, the sensing circuit 130 generates a second voltage indicative of a second temperature level of the second battery cell 62, based on a resistance of the resistive trace 112.

At step 708, the sensing circuit 130 generates a third voltage indicative of a third temperature level of the third battery cell 64, based on a resistance of the resistive trace 114.

At step 710, the sensing circuit 130 generates a fourth voltage indicative of a fourth temperature level of the fourth battery cell 66, based on a resistance of the resistive trace 116.

At step 712, the microprocessor 132 determines the first, second, third, and fourth temperature levels of the first, second, third, and fourth battery cells 60, 62, 64, 66, respectively, based on the first, second, third, and fourth voltages, respectively.

At step 714, the microprocessor 132 sends first, second, third, and fourth binary messages having the first, second, third, and fourth temperature values, respectively, therein corresponding to the first, second, third, and fourth temperature levels, respectively, of the first, second, third, and fourth battery cells 60, 62, 64, 66, respectively, to the electrical connector 134.

At step 716, the microprocessor 132 determines first, second, third, and fourth voltage values, respectively, indicating first, second, third, and fourth output voltages, respectively, of the first, second, third, and fourth battery cells 60, 62, 64, 66, respectively.

At step 718, the microprocessor 132 sends fifth, sixth, seventh, and eighth binary messages having the first, second, third, and fourth voltage values, respectively, to the electrical connector 134.

The above-described method can be at least partially embodied in the form of one or more computer readable media having computer-executable instructions for practicing the methods. The computer-readable media can comprise one or more of the following: hard drives, RAM, ROM, flash memory, and other computer-readable media known to those skilled in the art; wherein, when the computer-executable instructions are loaded into and executed by one or more microprocessors, the one or more microprocessors become an apparatus for practicing the methods.

The battery cell assembly provides a substantial advantage over other assemblies. In particular, battery cell assembly provides a technical effect of utilizing a thin sensor assembly having a flexible plastic sheet that is disposed between the stacked battery cells for determining temperature levels and voltages of the battery cells.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A battery cell assembly, comprising:
   a sensor assembly having a plastic sheet, first and second conductive pads, a first resistive trace, a sensing circuit, a microprocessor, and an electrical connector;
   the plastic sheet having first and second sides, first and second sheet portions, a first connecting portion coupled between the first and second sheet portions, and first and second tabs;
   the first connecting portion being coupled between the first and second sheet portions;
   the first resistive trace being coupled to the first sheet portion;
   the first and second conductive pads being coupled to the first and second tabs, respectively, on the first side;
   the microprocessor being coupled to at least one of the first and second sheet portions, and being electrically coupled to the sensing circuit and the electrical connector;
   the sensing circuit being coupled to at least one of the first and second sheet portions, and being electrically coupled to the first resistive trace;
   a first battery cell having a first housing and first and second electrical terminals extending from the first housing; the first housing being disposed directly on the first sheet portion on the first side; the first electrical terminal of the first battery cell being coupled to the first conductive pad; the second electrical terminal of the first battery cell being coupled to the second conductive pad.

2. The battery cell assembly of claim 1, wherein:
   the sensing circuit generating a first voltage that is indicative of a first temperature level of the first battery cell, based on a resistance of the first resistive trace;
   the microprocessor determining the first temperature level of the first battery cell based on the first voltage; and
   the microprocessor sending a first binary message having a first temperature value therein corresponding to the first temperature level of the first battery cell to the electrical connector.

3. The battery cell assembly of claim 1, wherein:
   the sensing circuit being electrically coupled to the first and second conductive pads;
   the microprocessor determining a first voltage value indicating an output voltage of the first battery cell based on a voltage received from the second conductive pad; and
   the microprocessor sending a first binary message having the first voltage value therein to the electrical connector.

4. The battery cell assembly of claim 1, wherein the first resistive trace has a thickness in a range of 0.33-1.0 millimeters.

5. The battery cell assembly of claim 4, wherein the first resistive trace is constructed of at least one of graphite, nickel, tin, silver, copper, or an alloy of at least two of the foregoing materials.

6. The battery cell assembly of claim 1, wherein the microprocessor is electrically coupled to the first and second electrical terminals of the first battery cell, the first and second electrical terminals of the first battery cell configured to supply an operational voltage to the microprocessor.

7. The battery cell assembly of claim 1, wherein the sensor assembly further includes a circuit board coupled to at least one of the first and second sheet portions, the microprocessor being coupled directly to the circuit board.

8. The battery cell assembly of claim 1, wherein:
   the sensor assembly includes third and fourth conductive pads and a second resistive trace; the second resistive trace being coupled to the second sheet portion;
   the plastic sheet having a third tab;
   the third conductive pad being coupled to the second tab on the second side, the third conductive pad being electrically coupled to the second conductive pad;
   the fourth conductive pad being coupled to the third tab on the second side;
   the sensing circuit being electrically coupled to the second resistive trace; and
   a second battery cell having a second housing and first and second electrical terminals extending from the second housing; the second housing being disposed directly on the second sheet portion on the second side; the first electrical terminal of the second battery cell being coupled to the third conductive pad; the second electrical terminal of the second battery cell being coupled to the fourth conductive pad.

9. The battery cell assembly of claim 8, wherein the first connecting portion is bendable such that the first sheet portion is disposed between and directly contacts the first and second housings, respectively, of the first and second battery cells, respectively.

10. The battery cell assembly of claim 8, wherein:
    the sensor assembly having fifth, sixth, seventh, and eighth conductive pads, and third and fourth resistive traces;
    the plastic sheet further having third and fourth sheet portions, second and third connecting portions, and fourth and fifth tabs;
    the second connecting portion being coupled between the second and third sheet portions; the third connecting portion being coupled between the third and fourth sheet portions;
    the sensing circuit being electrically coupled to the third and fourth resistive traces;
    a third battery cell having a first housing and first and second electrical terminals extending from the third housing; the third housing being disposed directly on the third sheet portion on the first side; the first electrical terminal of the third battery cell being coupled to the fifth conductive pad; the second electrical terminal of the third battery cell being coupled to the sixth conductive pad; and
    a fourth battery cell having a fourth housing and first and second electrical terminals extending from the fourth housing; the fourth housing being disposed directly on the fourth sheet portion on the second side; the first electrical terminal of the fourth battery cell being coupled to the seventh conductive pad; the second electrical terminal of the fourth battery cell being coupled to the eighth conductive pad.

11. The battery cell assembly of claim 10, wherein:
    the second battery cell being sandwiched between and directly contacting the first and second sheet portions on the second side;
    the third battery cell being sandwiched between and directly contacting the second and third sheet portions on the first side; and
    the fourth battery cell being sandwiched between and directly contacting the third and fourth sheet portions on the second side.

12. The battery cell assembly of claim 10, wherein:
    the third and fourth resistive traces being coupled to the third and fourth sheet portions, respectively;

the fifth conductive pad being coupled to the third tab on the first side, the fifth conductive pad being electrically coupled to the fourth conductive pad;

the sixth and seventh conductive pads being coupled to the fourth tab on the first and second sides, respectively; the sixth conductive pad being electrically coupled to the seventh conductive pad; and the eighth conductive pad being coupled to the fifth tab on the second side.

* * * * *